United States Patent [19]
Isokawa et al.

[11] Patent Number: 6,084,252
[45] Date of Patent: *Jul. 4, 2000

[54] SEMICONDUCTOR LIGHT EMITTING DEVICE

[75] Inventors: Shinji Isokawa; Hidekazu Toda, both of Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/113,302

[22] Filed: Jul. 10, 1998

[30] Foreign Application Priority Data

Mar. 10, 1997 [JP] Japan ................................. 9-271039
Jul. 30, 1997 [JP] Japan ................................. 9-204680

[51] Int. Cl.$^7$ ........................ H01L 33/00; H01L 27/15; H01L 31/12
[52] U.S. Cl. ........................ 257/98; 257/100; 257/95; 257/99
[58] Field of Search ................. 257/100, 98, 99, 257/95, 79; 435/25, 26

[56] References Cited

U.S. PATENT DOCUMENTS

| | | | |
|---|---|---|---|
| 3,739,241 | 6/1973 | Thillays | 317/235 |
| 3,760,237 | 9/1973 | Jaffe | 317/234 R |
| 3,863,075 | 1/1975 | Ironmonger et al. | 250/552 |
| 4,013,915 | 3/1977 | Dufft | 313/499 |
| 5,596,210 | 1/1997 | Konishi et al. | 257/98 |
| 5,798,536 | 8/1998 | Tsutsui | 257/99 |

FOREIGN PATENT DOCUMENTS 401152676  6/1989  Japan .
404162576  6/1992  Japan .

*Primary Examiner*—Mahshid Saadat
*Assistant Examiner*—Jesse A Fenty
*Attorney, Agent, or Firm*—Arent Fox Kintner Plotkin & Kahn, PLLC

[57] ABSTRACT

Obtained is a semiconductor light emitting device in which a light emitting device chip is bonded on a first lead and a second lead is electrically connected to one electrode of the light emitting device chip. Besides, the light emitting device chip and the top end of the second lead are enclosed by resin which a light from the light emitting device chip transmits. The first and second leads are respectively enclosed by heat resistant enclosing material along predetermined lengths of both leads at the bottom of the package, which is opposed to the light emitting surface. As a result, adhesiveness between the resin package and the leads is improved and thereby prevented is corrosion of the leads and the light emitting device chip in the package from occurring, which can make reliability improved.

9 Claims, 6 Drawing Sheets

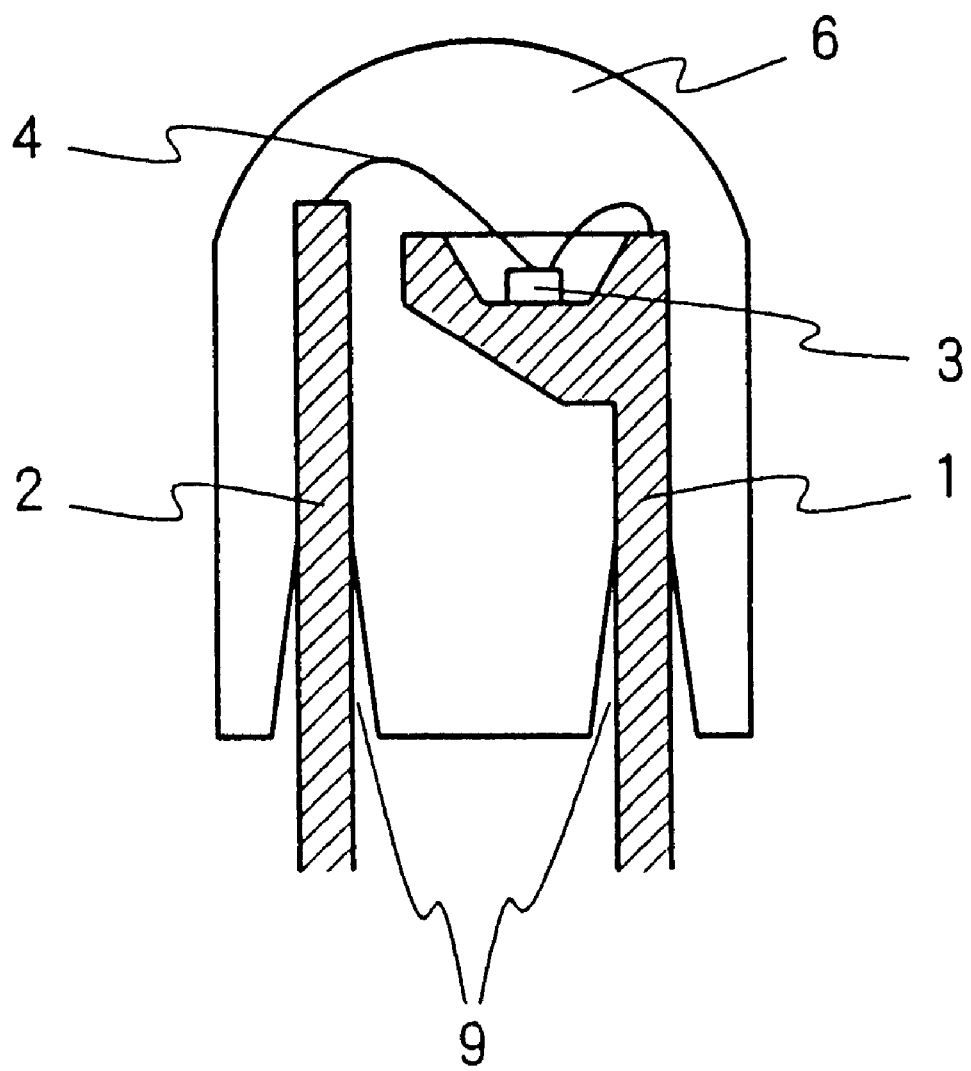

SEMICONDUCTOR LIGHT EMITTING DEVICE

BACKGROUND OF THE INVENTION

The present invention relates to a semiconductor light emitting device of a lamp type in which a light emitting device chip is molded in a resin. More particularly, the present invention relates to a semiconductor light emitting device in which penetration of wax during soldering and water after soldering between a resin plastic package and a lead is prevented from occurring.

Conventionally a semiconductor light emitting device has been fabricated in such a manner that a light emitting device chip (hereinafter referred to as LED chip) 3 having a semiconductor layered structure is bonded to a top end of a first lead 1 made of aluminum or the like, one electrode is connected to the first lead, the other electrode is connected to a second lead 2 by a gold wire 4 or the like and such an assembly is enclosed with a package 6 made of resin transparent to light of the LED chip 3 as shown in FIG. 9. This resin package 6 is usually formed by casting in which an assembly is immersed in resin filling a receptacle in the shape of a dome and the package 6 is molded into a form whose top is like a dome so that the light can be collected. For this reason, the whole surface of the package 6 is fabricated smooth with neither a recess/protrusion profile on the surface nor inclusion of impurities therein.

A resin package of a semiconductor light emitting device of this kind has heretofore been fabricated with epoxy resin in its greater part, wherein a heat resistant filler or the like cannot be mixed into the package since light is required to transmit the package with ease, as described above. Therefore, a heat resistance of the package is as poor as it can withstand at a temperature of the order of 100 to 140° C. at the highest. As a result, when a light emitting device is subjected to soldering, heat which reaches a lead degrades portions in the bottom side of the package 6, which the leads 1, 2 contact with, especially near a soldering point, as shown in FIG. 9, so that gaps 9 are formed between the leads and the package 6. There arise problems that flux or the like penetrate into the interior through the gaps during soldering and as a result, the leads are subjected to corrosion and a LED chip 3 and the like are also corroded. Besides, such gaps 9 between the leads 1, 2 and the package 6 which have occurred during soldering are not restored to the former condition after the soldering and when the device is in use later, there arises penetration of water, which corrodes the leads 1, 2, the LED chip 3 and the like, so that a problem arises that reliability is reduced.

SUMMARY OF THE INVENTION

It is an object of the present invention to provide a semiconductor light emitting device in which a light emitting device chip is enclosed by a resin package and a close contact condition between a package and a lead is improved so that corrosion of the lead and the LED chip is prevented from occurring, whereby reliability is improved.

It is another object of the present invention to provide a semiconductor light emitting device having a structure in which an enclosing material to protect the LED chip is utilized as an alternative to a tie bar on a lead frame and to form a cup (a concave portion with a curved surface) for collecting light from a LED chip portion, so that a step of cutting a tie-bar on a lead frame and a cup forming step in a condition coupled with a lead frame can be eliminated.

It is a further object of the present invention to provide a semiconductor light emitting device having a structure in which even when a package is formed by casting, no bubble occurs in the package by use of the enclosing material to protect the LED chip and the like.

A semiconductor light emitting device according the present invention comprises: a first lead; a light emitting device chip which is to be bonded on a die pad portion of the first lead; a second lead electrically connected to one electrode of the light emitting device chip; a resin package, which encloses the light emitting device chip and the top end of the second lead, and which a light from the light emitting device chip transmits, and a heat resistant enclosing material which enclose at least a part of the first and second leads.

The heat resistant enclosing material here means a material which has a heat resistance higher than the resin package and adhesiveness to a lead, and which can thereby properly enclose the lead, and for example, PPS (polyphenylene sulfide), a liquid crystal forming polymer, a heat resistant material containing thermosetting resin and the like can be used as a heat resistant enclosing material.

With such a structure, even when there is a possibility that a bottom portion of the resin package, with which leads whose temperature have risen in soldering contact, is subjected to separation, part enclosed by an enclosing material composing of a heat resistant resin or like does not have a chance for separation, whereby impurities, water and the like can be prevented from penetration into the interior of the device.

When the light emitting device chip is formed by a layered structure of gallium nitride based compound semiconductor, there is an effect that especially a protective element such as a Zener diode or the like, which has much of a chance to be provided for the bottom side of a lead, is prevented from being corroded. The gallium nitride based compound semiconductor means a semiconductor compound between Ga of the group III elements and N of the group V or the semiconductor compound, wherein part of the Ga of the group III elements is replaced with an element of the other group III elements such as Al, In and the like and/or part of the N of the group V elements is replaced with an element of the other V group elements such as P, As and the like.

When the heat resistant enclosing material is provided between the first and second leads in a continuous manner along a direction traversing both leads and the heat resistant enclosing material serves as an alternative to a tie bar which couples both leads in assembly, there arises no necessity for tie bar cutting of a lead frame after formation of a package.

The heat resistant enclosing material is preferably shaped so as to be shorter than the outer diameter of the package by some length, since not only is air easy to be escaped when the package formation is effected by casting but also the assembly can be protected by firm coating of the package resin.

When the heat resistant enclosing material has a shape having a slope that it is thin in the light emitting device chip side but thick in the package bottom side or a groove is formed on the outer surface of a shape of the heat resistant enclosing material, from end to end, along the axial direction of the respective first and second leads, bubbles have difficulty to occur in the package since the bubbles are not obstructed by the heat resistant enclosing material in escaping and thereby easy to flee away when the package is molded by casting.

When part of the heat resistant enclosing material forms a curved surface surrounding a die pad portion of the first lead, a cup (a concave portion with a curved surface) is not required to be formed in a condition coupled with a lead frame and therefore a complex step of forming a concave portion with a curved surface in the lead frame is not required, which entails reduction in the number of mandays by a great margin. When the heat resistant enclosing material is made to be white in color, a proportion of light radiating from the front surface is preferably increased due to reflection on the bottom surface.

When a recess/protrusion profile portion is formed on the outer surface of the structure of the heat resistant enclosing material along the axial directions of the first and second leads and the package is provided so as to copy the recess/protrusion profile on the outer surface while, for example, filling a recess, the heat resistant enclosing material and the package are preferably improved on the close contact condition with each other.

When the heat resistant enclosing material is provided almost all over the bottom area of the package, utilization efficiency of light is further increased.

BRIEF DESCRIPTION OF THE DRAWINGS

FIG. 9 is a view for illustrating an example of separation in a conventional manner between leads and a package due to heat from a conventional semiconductor light emitting device chip.

DETAILED DESCRIPTION

Figure 1:
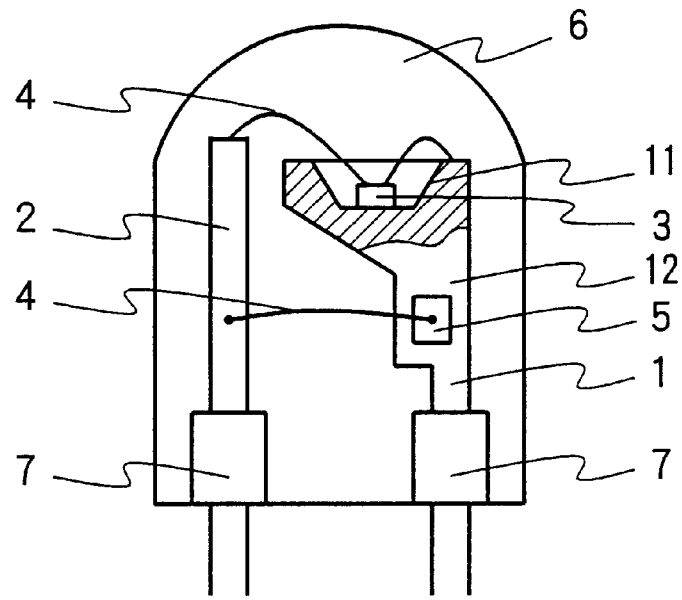
FIG. 1 is a sectional view in part for illustrating a first embodiment of a semiconductor light emitting device of the present invention.

A semiconductor light emitting device of the present invention has a structure that the top end of a first lead 1 is bonded with an LED 3, one of the electrodes is electrically connected to the first lead 1, the other electrode is electrically connected to a second electrode 2 by a gold wire 4 and the assembly is enclosed by a resin package 6, which light from an LED chip transmits, in a surrounding manner. Besides, at least parts of the first and second leads 1, 2 are respectively enclosed by a heat resistant enclosing material 7 along predetermined lengths of both leads at the bottom of the package 6, which is opposed to the light emitting surface (which surface is located on the LED chip 3 bonding side of the package 6 and has a shape of a dome). In an example shown in FIG. 1, a protective element for protection of the LED chip 3, such as a Zener diode chip 5, is inserted between the first and second leads 1, 2 for connection with a polarity reverse to the LED chip 3.

The first and second leads 1, 2 are fabricated from a plate about 0.4 to 0.5 mm thick made of iron or copper by punching and the top end of the first lead is subjected to stamping with a cone-shaped punch to thereby form a recess 11 like a cup. The recess 11 is formed by stamping and therefore the top end is of a shape that the peripheral portion is expanded to assume a cylinder, while the lower portion of the recess 11 keeps a flat surface as the original plate had, so that an overall section has a profile of a rectangle, open upward. In fabrication stages, the lower ends of the first and second leads are coupled with a lead frame by its frame portion.

The heat resistant enclosing material 7 is made of, for example, PPS and the first and second leads 1, 2 in a condition coupled with the lead frame are, for example, set in an injection mold die having a desired external shape of the heat resistant enclosing material 7 so that parts of the respective leads 1, 2, which are to be later disposed at the bottom of a resin package 6, are placed in the die and PPS of thermosetting resin is then injected into the die to fabricate the members of the heat resistant enclosing material 7. The structures of the heat resistant enclosing material 7 can be molded in any shapes with freedom according to a shape of the die and, for example, as shown in FIG. 1, the leads 1, 2 are isolatedly formed in the sectional shape of a circle, ellipse, a rectangle or the like.

Figure 7:
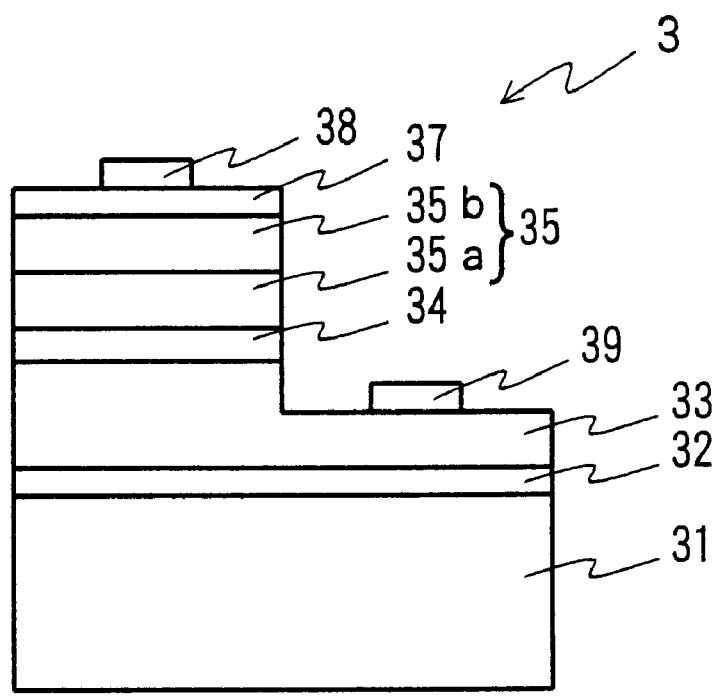
FIG. 7 is a sectional view for illustrating an example of the LED chip of FIG. 1.

The LED chip 3 is fabricated as a chip of blue emitting light (covering from ultraviolet to yellow) in a sectional structure, as shown by an example of FIG. 7. That is, the chip of blue emitting color is fabricated in such a manner that, for example, sequentially stacked on a substrate 31 made of sapphire ($Al_2O_3$ single crystal) are the following layers with respective thicknesses: a low temperature buffer layer 32 of the order of 0.01 to 0.2 $\mu$m in thickness made of GaN, an n-type cladding layer 33 of the order of 1 to 5 $\mu$m in thickness, an active layer 34 of the order of 0.05 to 0.3 $\mu$m in thickness made of InGaN based compound semiconductor (wherein a ratio between In and Ga can be set in various way and this is applied to the rest of the description) and a p-type cladding layer 35 of the order of 0.2 to 1 $\mu$m in thickness made of an AlGaN based compound semiconductor layer 35a (wherein a ratio between Al and Ga can be set in various way and this is applied to the rest of the description) and a GaN layer 35b and a p-side electrode 38 is formed with a current diffusion layer 37 interposing the electrode and the layered structure. Besides, parts of the thus stacked semiconductor layers 33 to 35 are removed to expose the n-type layer 33 and an n-side electrode 39 is provided on the n-type layer 33.

The Zener diode chip 5 is usually made of silicon semiconductor and the device utilizes a phenomenon that when a large backward voltage is applied to a pn junction in a semiconductor with a high impurity concentration, electrons flows through the pn junction by a tunnel effect. A voltage (Zener voltage) at which a backward current begins to flow is determined by an impurity concentration of the pn junction. Therefore, when the Zener voltage is set at a value higher than a working voltage of the LED chip 3 and the first and second leads are connected by the LED chip 3 and the Zener diode chip 5 disposed in parallel with reverse directions to each other, whereby the LED chip 3 has no obstacles in operation.

The LED chip 3 and the Zener diode chip 5 are respectively bonded to the recess 11 and a die pad portion 12 of the first lead 1 provided with the heat resistant enclosing material 7 with use of an adhesive such as silver paste or the like. The n-side and p-side electrodes 39, 38 (see FIG. 7) are respectively are connected to the first and second leads 1, 2 by gold wires 4 and a negative electrode (which means an electrode connected to an n-type layer) of the Zener diode chip 5 is connected to the second lead 2 by a gold wire 4, so that electrical connection between the electrodes and the leads are complete. In a fabricating process, the LED chip 3 is subjected to die bonding and wire bonding with a lead frame assuming a vertical position and then the Zener diode chip 5 is subjected to die bonding and wire bonding with a lead frame assuming a horizontal position. A positive electrode (which means an electrode connected to a p-type layer) of the Zener diode chip 5 is electrically connected directly to the first lead 1 with a conductive adhesive. As a further fabricating process, the package 6 is molded with use of transparent or milk-white epoxy resin which is transmitted by emitting light from the LED chip 3 and thereby a semiconductor light emitting device of the present invention, which is shown in FIG. 1, is obtained. The package 6 is molded into a dome like shape so as to be a convex lens in the light emitting side and thereby a light emitting device of a lamp type is obtained.

According to a semiconductor light emitting device of the present invention, at least parts of first and second leads, or more preferably the base portions of the first and second leads located at the bottom of a resin package are enclosed by heat resistant material. Therefore, when a light emitting device is soldered to a print substrate or the like, when a lead is subjected to solder plating or the like, there is no risk that the lead and the heat resistant enclosing material are separated from each other by heat, even if a temperature of the lead is raised by the heat. As a result, there are no possibility that the lead, a LED chip, a protective chip and the like are corroded or subjected to short circuit by a flux penetration into an intermediate of a device when soldering is conducted and thereafter water penetration into the device as a product and thereby reliability is greatly improved.

A Zener diode is provided to the device in parallel to the LED chip with a polarity of the Zener diode reverse to the LED chip and thereby with application of a backward voltage, application of a surge voltage higher than the Zener voltage, though in the forward direction or the like, the Zener diode works as a bypass to protect the LED chip. For that reason, the effect of this kind is great in the case of a blue LED chip using a gallium nitride based compound semiconductor which is weak to applications of a backward voltage or a high voltage in the forward direction.

Figure 2:
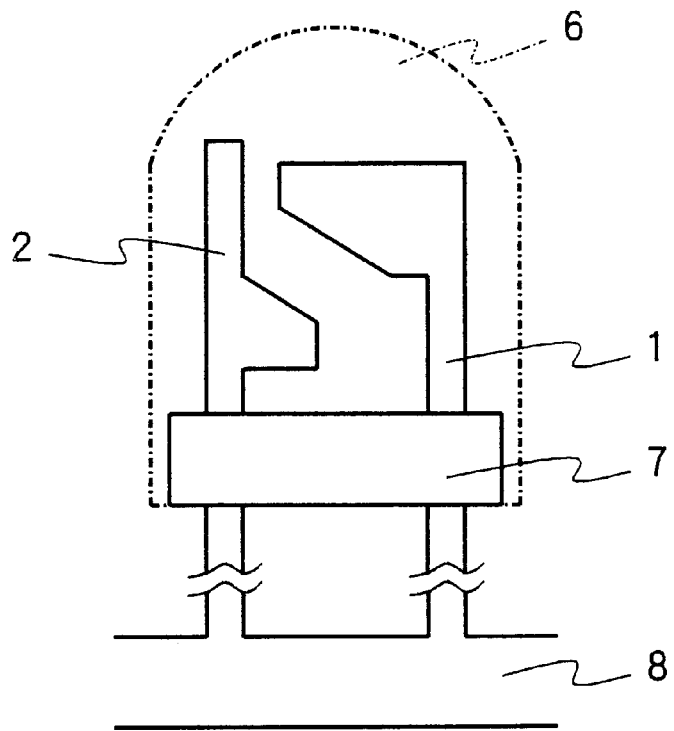
FIG. 2 is a side view for illustrating a second embodiment of a semiconductor light emitting device of the present invention.

FIG. 2 is a view for illustrating a second embodiment of a semiconductor light emitting device of the present invention. In this example, a structure of heat resistant enclosing material 7 having a length by a some amount shorter than the outer diameter of a resin package 6 are formed at the bottom of the package 6 so that first and second leads 1, 2 are coupled by the structure of heat resistant enclosing material 7. The heat resistant enclosing material 7 is formed in the shape of a rectangular parallelepiped (actually in a sectional shape of a polygon) whose thickness in a direction from the front side to the backside of the sheet on which FIG. 2 is drawn (that is, a thickness including the leads 1, 2) is set so as to indicate a value of about 0.2 mm in depth up to each surface of the first or second lead. The structure of the heat resistant enclosing material 7 is also molded by injection molding or the like in a similar manner to the above description still in condition of use of a lead frame. When the two leads are coupled by such heat resistant enclosing material 7 with a thickness almost equal to that of a lead frame, the heat resistant enclosing material 7 can works as an alternative to a tie bar, which has conventionally been attached to the leads 1, 2 at positions toward the top ends thereof away from a frame 8 of the lead frame for prevention of fluctuation in distance between the top ends of the respective leads or of leakage of molding resin in molding of a resin package from occurring. As a result, additional operations such as tie bar cutting and the like after the package 6 is complete can be eliminated.

In this example, the structure of the heat resistant enclosing material 7 is formed shorter than the outer diameter of the package 6 by some length and thereby air bleed can favorably be performed in molding by casting of the package 6. However, in the case of transfer molding, molding may be conducted in a manner such that the outer diameter of the package and the length of the frame may be same as each other.

Figure 3:
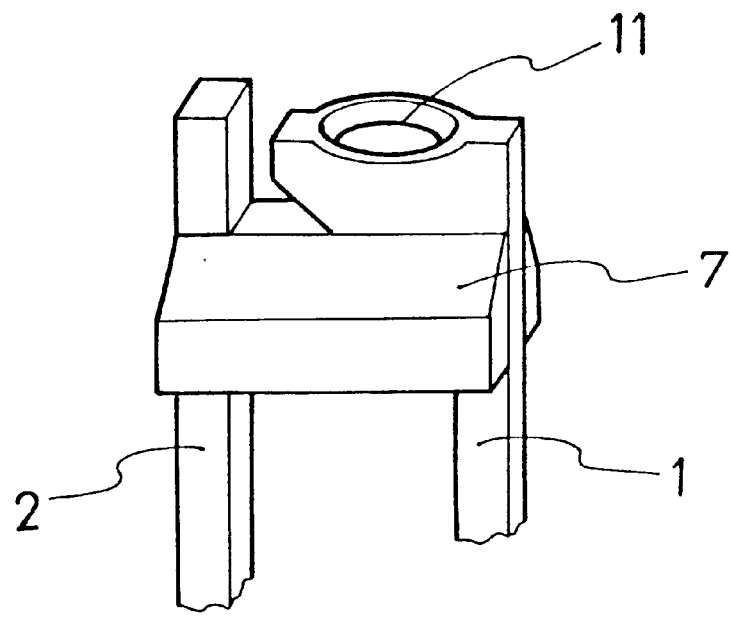
FIG. 3 is a view for illustrating a third embodiment of a semiconductor light emitting device of the present invention.
Figure 8:
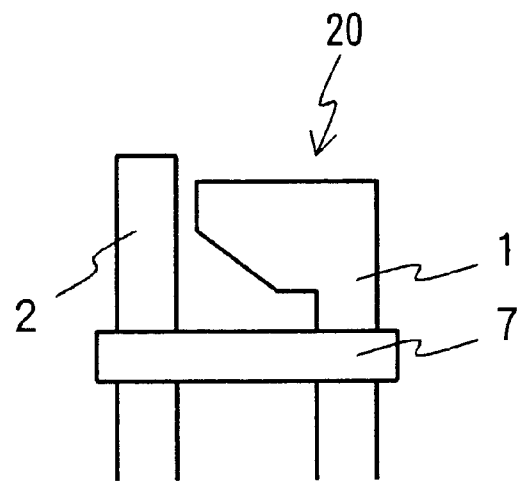
FIGS. 8(a) and 8(b) are views for illustrating the case where an assembly on a lead frame is mold by casting.
Figure 8:
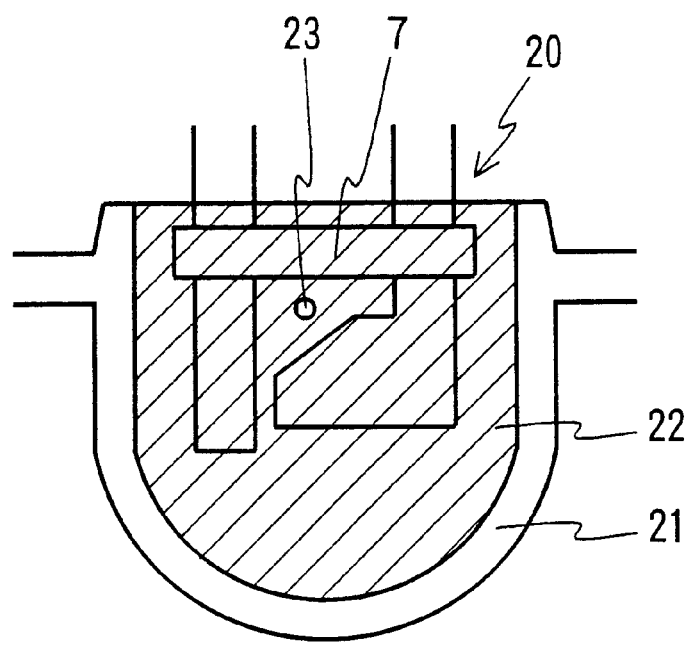

FIG. 3 is a view for illustrating a third embodiment of a semiconductor light emitting device of the present invention. In the case where a package 6 is molded by casting, since an assembly 20 as shown in FIG. 8(*a*) constructed from an LED chip and a protective element and the like, not shown, on a lead frame is put into a receptacle 21 filled with resin 22 upside down as shown in FIG. 8(*b*) and the resin is cured, bubbles 23 produced when the assembly 20 is put into the resin 22 are remained in the resin 22 since the way out is blocked by a structure of heat resistant enclosing material 7. The bubbles 23 make an appearance worsened and adversely act on homogeneity of light emission and therefore there are required a sufficient condition to let the bubbles flee away. In order to solve this problem, the upper side (LED chip side) of the heat resistant enclosing material 7 is narrowed in width and the bottom side thereof is broadened in width so that a slope is formed along the side, whereby the bubbles reaching the heat resistant enclosing material 7 are easy to flee further upwardly (upside down in casting). This slope is only required to make the bubbles 23 flee away upwardly in the receptacle 21 and thereby its surface is allowed not only to be straight in section but to be curved convex or concave.

Figure 4:
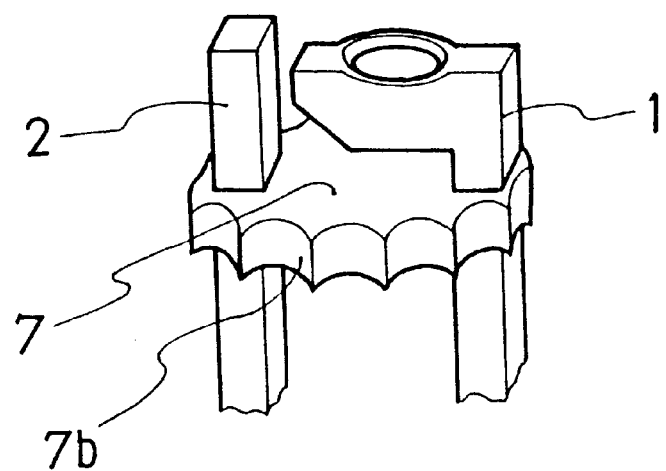
FIG. 4 is a view for illustrating a fourth embodiment of a semiconductor light emitting device of the present invention.

An example shown in FIG. 4 is an example in which production of bubbles is prevented in casting and while a slope is not provided for heat resistant enclosing material 7, concave portions 7B are formed and thereby an effective area of the vertical surface for catching the bubbles is decreased as much as possible and at the same time the bubbles are encouraged to flee away. That is, if many of such concave portions 7*b* are formed, resin moves along the concave portions 7*b* and thereby bubbles can escape with the help of the concave portions 7*b* when an assembly gets put into the resin for casting.

Figure 5A:
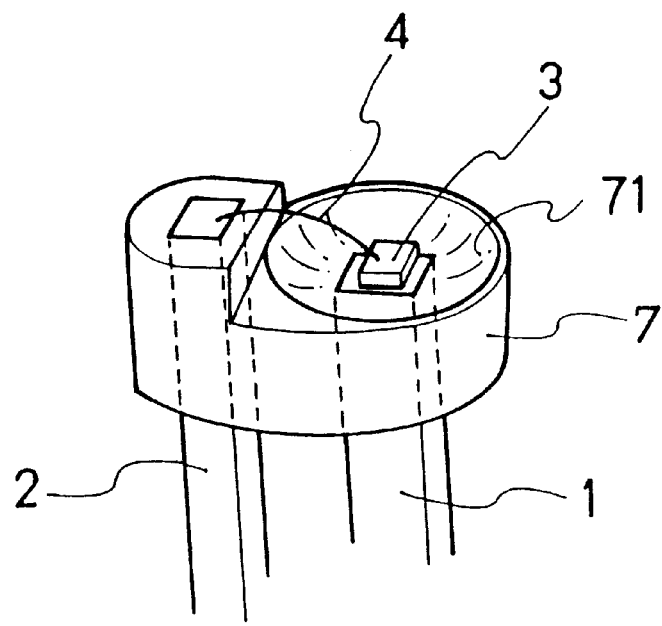
FIGS. 5(a) and 5(b) are views for illustrating a fifth embodiment of a semiconductor light emitting device of the present invention.
Figure 5B:
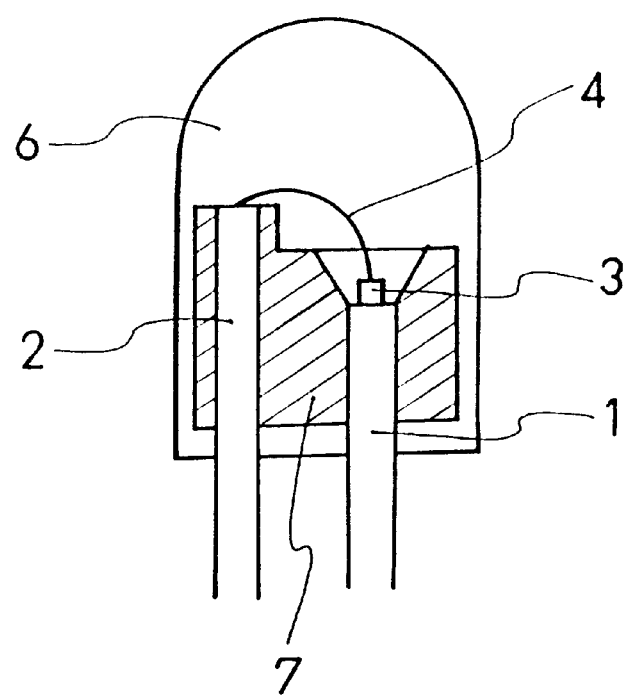

FIGS. 5(*a*) and 5(*b*) are views for illustrating a fifth embodiment of a semiconductor light emitting device of the present invention. This example shows the case where a curved surface 71 surrounding a die pad portion where an LED chip 3 is subjected to die bonding is formed with heat resistant enclosing material 7 as shown in a perspective view of FIG. 5(*a*) and in a sectional view for illustration of FIG. 5(*b*). That is, since the heat resistant enclosing material 7 is formed by molding such as injection molding as described above, it is only required to form a curved surface in a mold used in molding in order that the curved surface 71 like a cup is formed in one body with the heat resistant enclosing material 7. Bonding of the LED chip 3 and the like after molding of the heat resistant enclosing material 7 in the shape of the curved surface 71 and the following fabrication steps are same as the example shown in FIG. 1.

As a result, a great merits can be enjoyed since there are no needs for tie bar cutting of leads 1, 2 and formation of a recess with a curved surface of the top end of the leads 1 and especially a complex step of forming a recess on the top end of the lead 1 can be omitted in a condition coupled with the lead frame. In this case, if no attachment of the heat resistant enclosing material on the top ends of the leads 1, 2 is secured, the LED chip 3 can directly be bonded to one of the top ends for electrical connection, when one of the electrodes of the LED chip 3 is designed to be brought out from its backside. It is preferred that a white filler is mixed into the heat resistant enclosing material to show a white color and thereby a reflectance of light can be increased on the curved surface 71. For example, if it is assumed that a reflectance on a white color is 1.0, silver shows on the order of 0.6 to 0.7 in reflectance and therefore a reflectance is greatly improved by making the heat resistant enclosing material white. Besides, since the first and second leads 1, 2 are fixedly held at positions nearer the top ends as compared with a conventional case, the top ends are firmly fixed even in supersonic cleaning when wire boding is conducted and thereby working efficiencies in die bonding and wire bonding are improved by a great margin.

Figure 6:
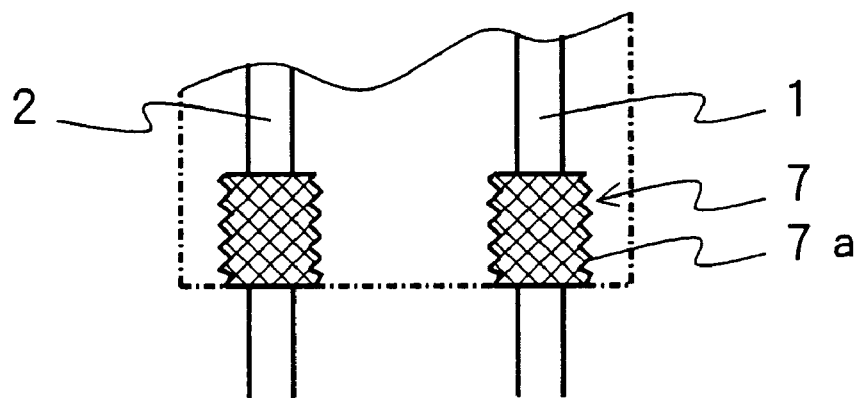
FIG. 6 is a view for illustrating a sixth embodiment of a semiconductor light emitting device of the present invention.

An example shown in FIG. 6 is an example in which a recess/protrusion portion 7a is formed on the surface of structures of heat resistant enclosing material 7 and with formation of such a recess/and protrusion portion 7a on the surface, adhesiveness with a surrounding package 6 is greatly improved and thereby prevented is penetration of not only flux when soldering is conducted but water and the like through an interface between the package 6 and the heat resistant enclosing material 7 from occurring.

While in the aforementioned examples, PPS is used as heat resistant enclosing material, it is to be understood that the heat resistant enclosing material is not limited to PPS but there can be used heat resistant thermosetting resins such as a liquid crystal forming polymer, an epoxy resin improved on heat resistance by being mixed with heat resistant filler and the like.

Heat resistance requirement is only to withstand a temperature in soldering and therefore heat resistance of 220° C. or higher is preferred. When thermosetting resin is used, potting can be used for the purpose instead of injection molding with use of a mold die as described above as well. Almost all the bottom area of the package 6, whose sectional shape is circular, can also be formed with the heat resistant enclosing material 7. In this case, if the bottom has a color which has a high reflectance, such as a white color, light directing to the bottom side is reflected on the bottom and then returned upwardly, which makes the emitted light effectively used.

According to the present invention, heat resistance in a joint between a lead and a package can be improved, no separation in raised temperature arises in the cases of soldering and the like and furthermore, penetration of not only flux when soldering is conducted but water in actual use can be avoided. As a result, a semiconductor light emitting device with high reliability can be obtained.

In addition, with use of a heat resistant enclosing material as an alternative to a tie bar, a step of a fabricating process such as tie bar cutting or the like can be omitted. With provision of the heat resistant enclosing material on whose outer surface a recess/protrusion profile is formed, adhesiveness of the package is improved, which makes reliability further improved.

With formation of a curved surface surrounding an LED chip by use of heat resistant enclosing material, a complex step of forming the curved portion in a condition coupled with a lead frame can be eliminated, which entails cost down. Still in addition, deflection of the top end of a lead can be prevented and thereby workabilities in die bonding and wire bonding are improved.

Although preferred embodiments have been described in some detail, it is to be understood that certain changes can be made by those skilled in the art without departing from the spirit and scope of the invention as defined by the appended claims.

What is claimed is:

1. A semiconductor light emitting device comprising:
   a first lead;
   a light emitting device chip which is bonded on a die pad portion of said first lead;
   a second lead electrically connected to one electrode of said light emitting device chip;
   a resin package made of epoxy resin, which encloses said light emitting device chip and a top end of said second lead, and which a light from said light emitting device chip transmits; and
   a heat resistant enclosing material, which is provided on a bottom side of said resin package so as to enclose at least a part of said first and second leads, and a side portion of said heat resistant enclosing material is enclosed by said resin package, wherein a heat resistance of said heat resistant enclosing material is higher than a heat resistance of said resin package.

2. A semiconductor light emitting device according to claim 1, wherein said light emitting device chip is formed by a layered structure of gallium nitride based compound semiconductor.

3. A semiconductor light emitting device according to claim 1, wherein said heat resistant enclosing material is provided between the first and second leads in a continuous manner along a direction traversing both said leads, and said heat resistant enclosing material serves as an alternative to a tie bar which couples both said leads in assembly.

4. A semiconductor light emitting device according to claim 3, wherein said heat resistant enclosing material has an outer shape having a slope that is thin in said light emitting device chip side but thick in said resin package bottom side.

5. A semiconductor light emitting device according to claim 3, wherein a groove is formed on an outer surface of an outer shape of said heat resistant enclosing material, from end to end along an axial direction of said first and second leads.

6. A semiconductor light emitting device according to claim 1, wherein a part of said heat resistant enclosing material forms a curved surface surrounding a die pad portion of said first lead.

7. A semiconductor light emitting device according to claim 6, wherein said heat resistant enclosing material is made to be white in color.

8. A semiconductor light emitting device according to claim 1, wherein a recess/protrusion profile portion is formed on an outer surface of a structure of said heat resistant enclosing material along an axial directions of said first and second leads and said resin package is provided so as to copy the recess/protrusion profile on an outer area while filling a recess.

9. A semiconductor light emitting device according to claim 1, wherein said heat resistant enclosing material is provided almost all over a bottom surface of said resin package.

* * * * *